United States Patent [19]
Maroushek

[11] Patent Number: 5,335,144
[45] Date of Patent: Aug. 2, 1994

[54] MODULAR STACKED HOUSING ARRANGEMENT

[75] Inventor: Timothy R. Maroushek, Lino Lakes, Minn.

[73] Assignee: Samar Enterprises Company, Ltd., Taipei, Taiwan

[21] Appl. No.: 969,892

[22] Filed: Nov. 2, 1992

[51] Int. Cl.$^5$ .................................................. H05K 7/20
[52] U.S. Cl. .................... 361/695; 165/122; 174/16.1; 361/731; 454/184
[58] Field of Search ............... 200/289, 307; 361/393, 361/394, 396, 382–384, 729, 730, 731, 732, 735, 689, 690, 692, 694, 695; 439/485; 165/80.3, 122, 126; 174/15.1, 16.1; 454/184; 62/259.2, 418

[56] References Cited
U.S. PATENT DOCUMENTS

| | | |
|---|---|---|
| 3,054,024 | 9/1962 | Van Dillen et al. . |
| 4,137,559 | 1/1979 | Reuting . |
| 4,158,875 | 6/1979 | Tajima .................................. 62/418 |
| 4,501,460 | 2/1985 | Sisler . |
| 4,503,484 | 3/1985 | Moxon . |
| 4,558,914 | 12/1985 | Prager et al. . |
| 4,773,868 | 9/1988 | Heinecke . |
| 4,858,070 | 8/1989 | Buron et al. . |
| 5,006,959 | 4/1991 | Freige et al. . |
| 5,057,971 | 10/1991 | Hautvast .................................. 361/396 |
| 5,067,040 | 11/1991 | Fallik . |
| 5,163,870 | 11/1992 | Cooper .................................. 361/384 |
| 5,208,734 | 5/1993 | Someno .................................. 361/388 |

FOREIGN PATENT DOCUMENTS 1405095  6/1988  U.S.S.R. .............................. 361/393

*Primary Examiner*—Gerald P. Tolin
*Attorney, Agent, or Firm*—Haugen and Nikolai

[57] ABSTRACT

A stacking arrangement for combining a plurality of discrete interconnected electronic modules in aligned stacked relation includes a plurality of modules having discrete three-dimensional housing enclosures. Integral cooperating pin and socket electrical connector units are mounted in the top and bottom panels for interconnecting respective facing panels of juxtaposed modules electrically to interconnect all stacked modules in a manner not externally visible. An integral intermodular ventilation system is provided that has matching openings in corresponding facing top and bottom surfaces of the modules in aligned relation to accommodate continuous vertical intermodular air flow and includes one or more fans for pressurizing the stack and impelling air to flow through the stacked modular arrangement. A cover mounts on top of the ultimate functional module covering the pin and socket connecting unit of the top module and contains a plurality of side openings to accommodate outward ventilation flow.

10 Claims, 2 Drawing Sheets

MODULAR STACKED HOUSING ARRANGEMENT

BACKGROUND OF THE INVENTION

I. Field of the Invention

The present invention is directed generally to the field of housing assemblies for electronic equipment and, more particularly, to a compact ventilated arrangement for combining a plurality of housings aligned in stacked parallel relation in which the housings contain discrete functional units such as disk drives and in which the housings are connected electrically in parallel to a common pass-through electrical bus.

II. Description of the Related Art

Personal computer systems and peripherals are commonly provided with a power supply that supplies a plurality of discrete functional units or auxiliary devices in parallel with respect to a common bus. In this manner, a number of circuit boards may be provided which are mounted in spaced parallel relation, each carrying a functional unit and each having edge connectors or contact areas which connect to a different connector in a main or mother board. If the system is expanded beyond the number of units or boards that can be directly accommodated by the mother board, an additional enclosure with additional connecting capacity must be provided and interconnected to the mother board as by an external pigtail joiner arrangement.

Modular side-by-side or stacked arrangements are known in which each separate functional unit is provided with a housing. Commonly one module is a power supply module which serves as a base module on which the others are stacked. Other modules may have floppy disk drives, detailed data storage, or the like. Each housing, in turn, is provided with pin and socket connector arrangements adapted to align with and engage those of other units in a manner such that all the units can be connected together in modular fashion in parallel with a common power supply and data bus. One stacking arrangement with a plurality of enclosures in which each enclosure is provided with a male connector on one side and a female connector on the other is disclosed by Buron et al in U.S. Pat. No. 4,858,070 and Sisler in U.S. Pat. No. 4,501,460.

Each individual unit in such a system typically also generates an amount of heat which must be dissipated by conductive heat transfer or a ventilation means. In this regard, it is also known to provide a common ventilation system in which a blower or exhaust fan is associated with the power module such that cooling air is aspirated through vents in several units and exhausted from the power module. Such an arrangement is also shown by Buron et al in the above-mentioned reference.

Such arrangements have alleviated some of the problems associated with integrating a plurality of individual functional units with a common power supply and data bus. However, there remains a need for providing a stacked modular system of such units that allows free module interchangeability and add-ons, which, at the same time, not only affords proper continuity of ventilation and electrical interconnecting, but also protects both the power connection and ventilation access of all modular units including the exposed ultimate unit.

Accordingly, it is an object of the present invention to provide an improved modular stacking arrangement for distributively interfacing a plurality of separately housed functional units to be used with a personal computer which provides protected hidden electrical interconnects and positive flow through ventilation.

Another object of the invention is to allow free interchangeability of modular units of different sizes in such a system.

Still another object is to provide such a system in which the outer electrical connector and vent openings of the ultimate functional modular unit are protected.

Other objects and advantages will become apparent in connection with the detailed description provided below take together with the several drawing Figures.

SUMMARY OF THE INVENTION

In accordance with the present invention, many of the problems and inconveniences associated with a stacking arrangement for combining several discrete interconnected electronic modules in aligned parallel relation are solved by the provision of a system in which external pin and socket electrical connectors are protected as well as inlet and outlet openings associated with a flow-through, intermodule ventilation system.

The preferred system provides the ability to stack a plurality of modular housings or functional units of different thicknesses interchangeably aligned in a stacked arrangement. Integral cooperating pin and socket electrical connector units associated with the top and bottom surfaces of each modular housing unit allow for easy connection and removal of intermediate units. The modular housings are also designed to become part of an intermodular ventilation system by including matching openings in the corresponding facing top and bottom panels of the modules in stacked relation to accommodate continuous vertical intermodule ventilation flow. A cover or lid is provided which fits the top of the ultimate or top module of the stacked system. The cover or lid plugs into the socket of the uppermost pin and socket connecting unit in the system enabling input and output signals received at the top cover to pass through the terminals unaffected and loop back into the electrical system of the modules, and also provides side vent holes to exhaust the air flowing through the intermodular ventilation system. A hook and latch system may be provided so that the top functional module and the cover member hook together at one end and are plugged together by the pin and connector system at the other.

The first module is a base or power-pack module which contains the power supply for the entire modular system and also contains a ventilation fan which utilizes a plurality of perforations or holes in the lower panel of the base module as an intake and thereafter pressurizes the rest of the system causing air flow upward through the corresponding aligned openings in the upper stacked modules and causing the air to exit through the side ports in the cover or lid. The cover or lid is readily removable and any of the modules above the base or power-pack module can be removed and replaced at will in a few seconds by simply unplugging the pin and socket connectors of one module and replacing it with another. The lid is then replaced over the top or ultimate module. The use of side holes rather than top holes in the lid and pressurization of the module, of course, prevents any contamination of the system by dirt or other debris entering the top and the upward flow of the ventilating air, of course, augments any stack effect which might create somewhat of a natural draft. Of course, additional ventilation fans may be used in any module including the cover.

The system can be used with any number of modules such as those operating floppy disk drives, data storage units, etc. which are within the capacity of the power supply and the ventilation fans supplied in the base module and possibly other modules. Accordingly, such units may be sized with any desired expansion capability.

BRIEF DESCRIPTION OF THE DRAWINGS

In the drawings wherein like numerals are utilized to designate like parts throughout the same.

DETAILED DESCRIPTION

Figure 1:
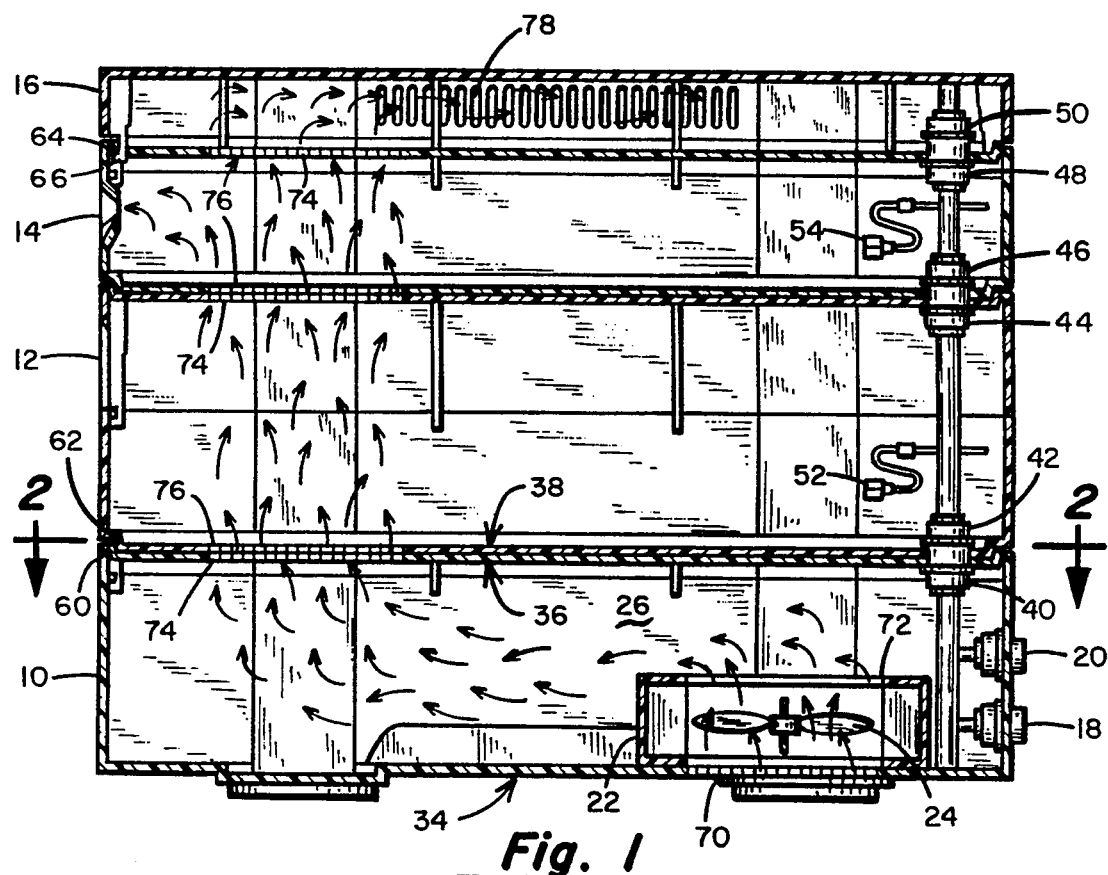
FIG. 1 is a longitudinal sectional view through a modular stacking arrangement in accordance with the invention.

FIG. 1 is a longitudinal section view of a three-unit modular stacking arrangement in accordance with the invention. The arrangement includes a base module 10 and auxiliary stacked modules 12 and 14 together with a cap or lid member shown at 16. The base module 10 includes a power supply and input/output personal computer interface connections as at 18 and 20. A ventilation system including a housing 22 and air moving system evidenced by an impeller member 24 is also shown in FIG. 1.

Figure 2:
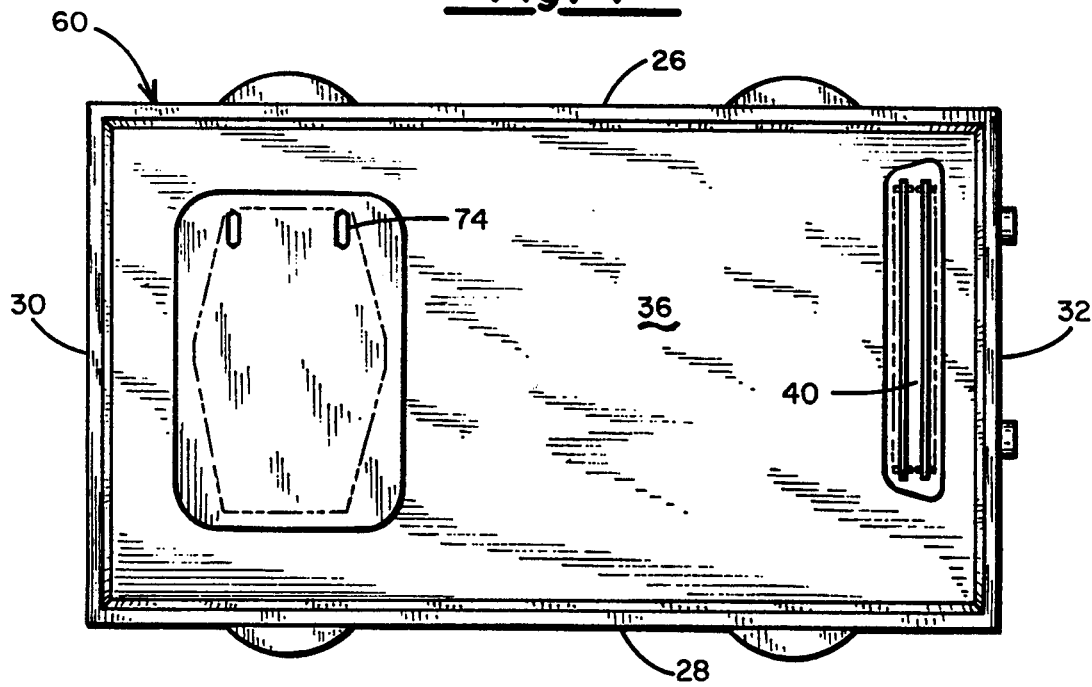
FIG. 2 is a view along lines 2—2 of FIG. 1 depicting the top view of the base module of FIG. 1.
Figure 4:
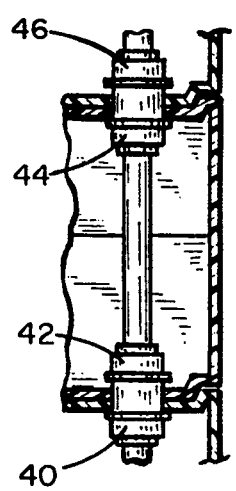
FIGS. 3 and 4 depict typical electrical connector system between modules.
Figure 3:
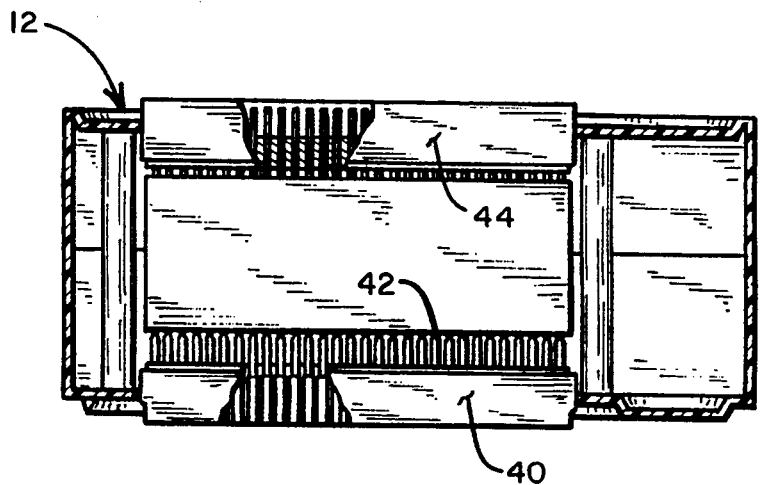

As can be seen in FIGS. 1 and 2, each of the modular sections 10, 12 and 14 has a three-dimensional housing including pairs of spaced, oppositely disposed side walls as at 26, 28 and 30 and 32 (FIG. 2) which, in turn, space bottom and top panels as at 34 and 36, etc. As seen in FIG. 1, the modular units can be of different heights or thicknesses depending on the functional system that is contained within the unit.

The units interconnect electrically using aligned top panel/bottom panel pin and socket systems such as illustrated in the Figures. A female connector 40 which may contain a large number of sockets is shown in FIG. 2. This is connected to male connector 42 in the bottom of module 12 which, likewise, has a top connector 44. Module 14 has connectors 46 and 48 and the cover member is provided with a dummy or unconnected plug 50 which retains the rear portion of the cover and allows electrical power and signals to pass through unaltered. Harnesses 52 and 54 indicate further input/output connections within the modules 12 and 14.

Each of the modules units or unit housings may further be provided with matching peripheral protuberances 60 and indentation 62 to provide alignment guidance for fitting the modules together which, at the same time, necessarily align the electrical connectors so that the modules, once aligned, can simply be pressed together thereby achieving electrical connection. In addition, the alignment guides 60 and 62 further assist in protecting the connection from contamination by the external environment. As can be seen from the Figures, the connections are completely hidden from view and need for any modular interconnecting external wire harnesses has been eliminated within the system. The illustrated uppermost module 14, in FIG. 1, is illustrated as having a hooking arrangement at 64, 66 to secure the front end of the lid 16 in place. Whereas the back end snaps in via connectors 50 and 48, it will be appreciated that the structure can be made identical to that as between modules 10, 12 and 14 so that any module can be the ultimate module which fits adjacent the cover or cap.

The ventilation system includes inlet openings in the base or power module 12 as at 70; the ventilating air is thereafter pushed through openings in the upper panel 72 of a fan housing 22 and thereafter circulated through the entire modular system through matching upper modules openings 74 and lower modular openings 76 in the several modular units. The size of the fan unit, of course, is made commensurate with the number and size of modules anticipated to be used in a fully developed stack taking into consideration combination of convection and conduction heat transfer in view of the anticipated required total heat dissipation requirements.

Exit holes as at 78 are preferably provided in both sides of the lid member 16 to exhaust the cooling air. The top panel of the lid 16 is solid and protects both the connection 50/48 and by using side holes 78 rather than top holes, of course, prevents settling dust, or the like, from entering the system. The ventilation system can be provided with any type of a filter desired at the inlet to prevent debris from entering in that manner. These are two distinct advantages of configuring the ventilation system in accordance with the invention. Another advantage resides in the fact that the ventilation fan or pump in the module 10 is part of a push-through rather than a pull-through system which thereby provides each stacked module in the system with at least a slight positive pressure causing any leakage to be outward rather than inward in such a manner as to decrease the likelihood of the entry of any unwanted debris.

Figure 5:
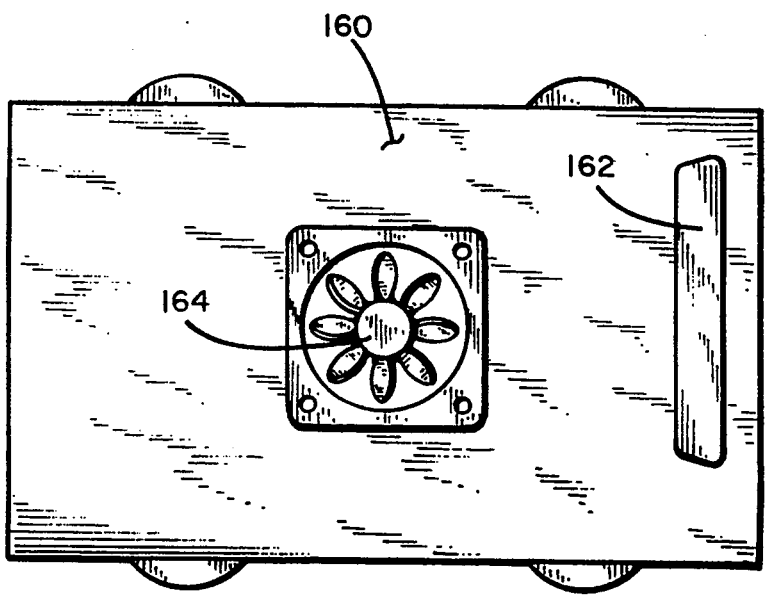
FIG. 5 depicts the inside of a lid unit having an auxiliary fan.

FIG. 5 depicts an alternate embodiment of the lid at 160 including top pass-through electrical connector 162 and an auxiliary fan unit having a blade shown at 164. The auxiliary fan is designed to augment and increase the ventilation flow of the base module unit fan. The intake is on the bottom and air is exhausted through holes 78 (FIG. 1).

Of course, the electrical connections illustrated allow any module regardless of its location in the stack to have the desired access to any other module or any common electrical or data bus within the entire PC system. It will further be appreciated that the appearance of the stack is neat and compact. It eliminates the need for unsightly external wires except for necessary PC interface connections as at 18 and 20.

This invention has been described herein in considerable detail in order to comply with the Patent Statutes and to provide those skilled in the art with the information needed to apply the novel principles and to construct and use embodiments of the example as required. However, it is to be understood that the invention can be carried out by specifically different devices and that various modifications can be accomplished without departing from the scope of the invention itself.

For example, it will further be appreciated that the modules can be readily removed and replaced by simply plugging and unplugging them as desired. Thus, for example, additional floppy disk drive modules or data storage may be added as desired. In addition, intermodular pads may be used to cushion and separate the mating surfaces or panels of adjacent modules, as desired. While only the base or power module 10 and possibly the lid have been shown to contain a fan unit, it is apparent that other modular units in the stack may be provided with their own ventilating fans which, in turn, can be used to augment or amplify the air circulation provided, it being realized that such modules may also have their own side vent openings. The bottom to top circulation also cooperates with whatever natural chimney or stack effect draft which exists from the bottom to the top of the modular stack.

I claim:

1. A snap-fit stacking arrangement for combining a plurality of discrete self-contained interconnected electronic modules in aligned stacked relation comprising:
   (a) a plurality of discrete self-contained snap-attached modules including a base module and one or more interchangeable, functional intermediate modules, each having discrete three-dimensional housing enclosures including pairs of spaced, oppositely disposed sidewalls and top and bottom panels adapted to be plugged together in parallel stacked relation and a cover module;
   (b) integral cooperating pin and socket pass-through electrical connector units associated with the top and bottom panels for interconnecting respective facing top and bottom panels of juxtaposed modules electrically with one another in a manner which internally interconnects all stacked modules using connectors not eternally visible on the connected stack;
   (c) intermodular ventilation system comprising common inlet and outlet means and matching pass-through openings in corresponding top and bottom panels of the base and intermediate modules;
   (d) circulation means for pressurizing and impelling air flow through the stacked modular arrangement; and
   (e) wherein said cover module is disposed on top of the one or more modules of the plurality of self-contained modules covering and protecting an otherwise exposed pin and socket connecting unit of the top surface of the plurality of stacked intermediate modules, the cover module being further provided with a plurality of side exhaust openings to accommodate ventilation flow.

2. The stacking arrangement of claim 1 wherein the stacked discrete, self-contained modules further comprise a matching peripheral lip and recess system to guide and assist proper fitting alignment.

3. The stacking arrangement of claim 1 wherein the ventilation system further comprises:
   (a) fan means in the base module of the stack of modules;
   (b) common ventilation air inlet in the base module; and
   (c) wherein the fan means draws air through the common ventilation inlet and causes the air to flow through the entire stack thereby pressurizing the stack of modules and be discharged from the outlet openings.

4. The stacking arrangement of claim 3 wherein the outlet openings are along both sides of the cover.

5. The stacking arrangement of claim 3 wherein the ventilation system further comprises auxiliary fan means in the cover module to augment the fan means in the base module.

6. The stacking arrangement of claim 1 wherein the stacked modules are geometrically congruent in plan.

7. The stacking arrangement of claim 6 wherein the stacked discrete, self-contained modules further comprise a matching peripheral lip and recess system to guide and assist proper fitting alignment.

8. The stacking arrangement of claim 1 wherein the cover module further comprises hook means associated with one end thereof and wherein the ultimate module further comprises a latch means adapted to cooperate with the hook means, the hook and latch being located at the end of the cover module and ultimate module at the end further from the pin and socket electrical connector units.

9. The stacking arrangement of claim 8 further comprising auxiliary fan means in the cover module to augment the fan means in the base module.

10. The stacking arrangement of claim 1 wherein the stacked modules are geometrically congruent.

* * * * *